United States Patent
Ng et al.

(10) Patent No.: US 6,815,992 B1
(45) Date of Patent: Nov. 9, 2004

(54) CIRCUIT FOR TESTING AND FINE TUNING INTEGRATED CIRCUIT (SWITCH CONTROL CIRCUIT)

(75) Inventors: Philip S. Ng, Cupertino, CA (US); Ken Kun Ye, Fremont, CA (US); Jinshu Son, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/607,286

(22) Filed: Jun. 25, 2003

(51) Int. Cl.[7] .................. H03K 3/037; H03K 17/62
(52) U.S. Cl. ............................. 327/199; 327/407
(58) Field of Search .................... 327/99, 199, 208, 327/210, 214, 216–218, 221–224, 407–408; 326/30, 86

(56) References Cited

U.S. PATENT DOCUMENTS

| | | | | |
|---|---|---|---|---|
| 5,128,974 A | * | 7/1992 | Maekawa | ........... 377/81 |
| 5,708,455 A | * | 1/1998 | Maekawa | ........... 345/100 |
| 6,424,186 B1 | * | 7/2002 | Quimby et al. | ........... 327/108 |

* cited by examiner

*Primary Examiner*—My-Trang Nu Ton
(74) *Attorney, Agent, or Firm*—Schneck & Schneck; Thomas Schneck

(57) ABSTRACT

A switch controlling circuit for the testing and fine-tuning of integrated circuits comprising of a series of flip-flops chain together in a serial manner. The contents of the flip-flop are shift in from the input of the first flip-flop in the chain. The output of each flip-flop connects to individual switch whereby the states of the flip-flops control the state of the switches.

7 Claims, 3 Drawing Sheets

CIRCUIT FOR TESTING AND FINE TUNING INTEGRATED CIRCUIT (SWITCH CONTROL CIRCUIT)

TECHNICAL FIELD

The present invention relates to the circuitry for the testing and fine-tuning integrated circuit. In particular, the present invention relates to circuit for the control of switches in an integrated circuit.

BACKGROUND ART

In integrated circuits, test circuits are implemented to test and to make fine adjustments. For instance, a nonvolatile memory in a new chip may have an initial endurance of five thousand endurance cycles, each cycle including an erasure step (releasing electron) and a programming step (trapping electrons). By controlling the amount of electrons entering the floating gates in nonvolatile memory cells in each cycle, it is possible to dramatically increase the endurance of the nonvolatile memory. The amount of electrons entering the floating gates can be regulated by varying the bitline and wordline voltages. Therefore, by fine-tuning the bitline and wordlines voltages, one can increase the endurance of the nonvolatile memory.

FIG. 1 shows a test circuit for controlling the voltage of a wordline 12 of a flash memory device. The test circuit is implemented with a set of resistors, $R_1, R_2, \ldots, R_n$, having different resistances and a fuse block 10. Each resistor in the test circuit is connected to the drain of a NMOS transistor, $F_1, F_2, \ldots, F_n$. The source of each NMOS transistor connects to a ground while the gate of each NMOS transistor connects to the fuse block 10. The NMOS transistor functions as a fuse-activated switch, that is, depending on the output signal from the fuse block 10, it either connects or disconnects its corresponding resistor to ground. The resistors, $R_1, R_2, \ldots, R_n$, are carefully chosen to provide an incremental set of wordline voltages. To obtain a desirable wordline voltage 12, an iterative process is used whereby the NMOS transistors, $F_1, F_2, \ldots, F_n$, are activated individually or in a group until the desired wordline voltage is detected at the output 12.

Presently, the fuse block circuit 10 is implemented using nonvolatile memory cells, which, in addition to having endurance issues, requires supporting circuitry such as charge pumps and timing circuits that take up valuable chip space. Therefore, it would be desirable to have a fuse block circuit 10 that does not have endurance issues and does not require an excessive amount of supporting circuitry.

DISCLOSURE OF INVENTION

The present invention controls a plurality of switches through the outputs of a plurality of flip-flops. The flip-flops may be connected in a serial manner wherein the states are shifted into each flip-flop through an input terminal of the first flip-flop in the chain. Alternative, the state of each flip-flop could be loaded individually. The state in each flip-flop is applied from its output terminal to the gate of a corresponding transistor acting as a switch. The input terminal of the first flip-flop may be connected to a two-input multiplexer, wherein the first input terminal of the multiplexer connects to a data input terminal for the purpose of shifting states into the flip-flop chain and the second input terminal of the multiplexer connects to the output of the last flip-flop, providing a return path for the states during a read-out.

BEST MODE OF CARRYING OUT THE INVENTION

Figure 1:
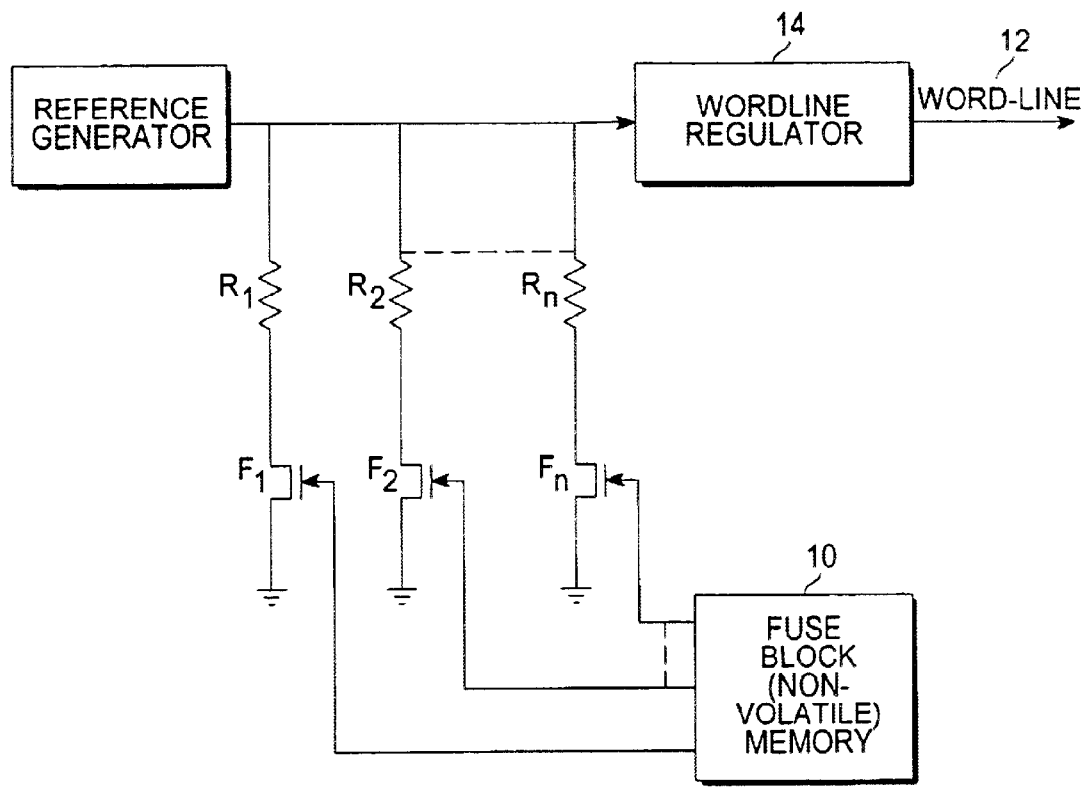
FIG. 1 is a circuit diagram showing a prior art fine-tuning circuit for a nonvolatile memory.
Figure 2:
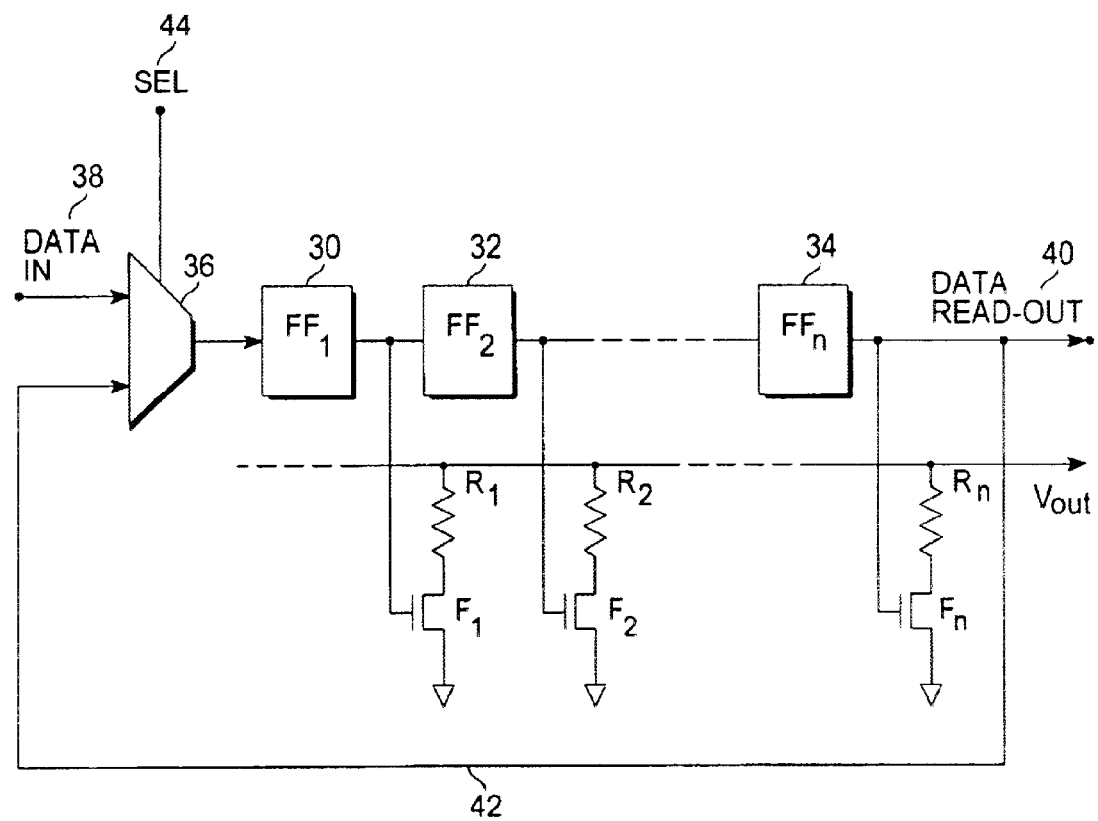
FIG. 2 is a circuit diagram showing a preferred embodiment of a fuse block circuit disclosed in the present invention.

In FIG. 2, a series of flip-flops 30, 32, . . . , 34 are shown to be connected to one another in a way such that the output of each preceding flip-flop 30 is connected to the input of a succeeding flip-flop 32. The contents of the flip-flops are shifted in serially through a data-in terminal 38 of a two-input multiplexer 36, The output of each flip-flop connects to an individual switch, which can come in the form of a MOS transistor $F_1, F_2, \ldots, F_n$, like those shown in FIG. 1. Each transistor switch is connected to resistors $R_1, R_2, \ldots, R_n$ coupled in parallel to a voltage output.

To read the flip-flops, the contents of the flip-flops can be shifted out serially through the output 40 of the last flip-flop 34. In order to reload the content after a read, the read-out contents are recycled back to the flip-flops through a return path 42 that connects the output 40 of the last flip-flop 34 to a second input of the two-input multiplexer 36. During a read, a proper select signal at the SEL 44 input of the multiplexer 36 connects the Data read-out terminal 40 to the input of the first flip-flop 30, thereby providing a return path for the read-out contents of the flip-flops.

Figure 3:
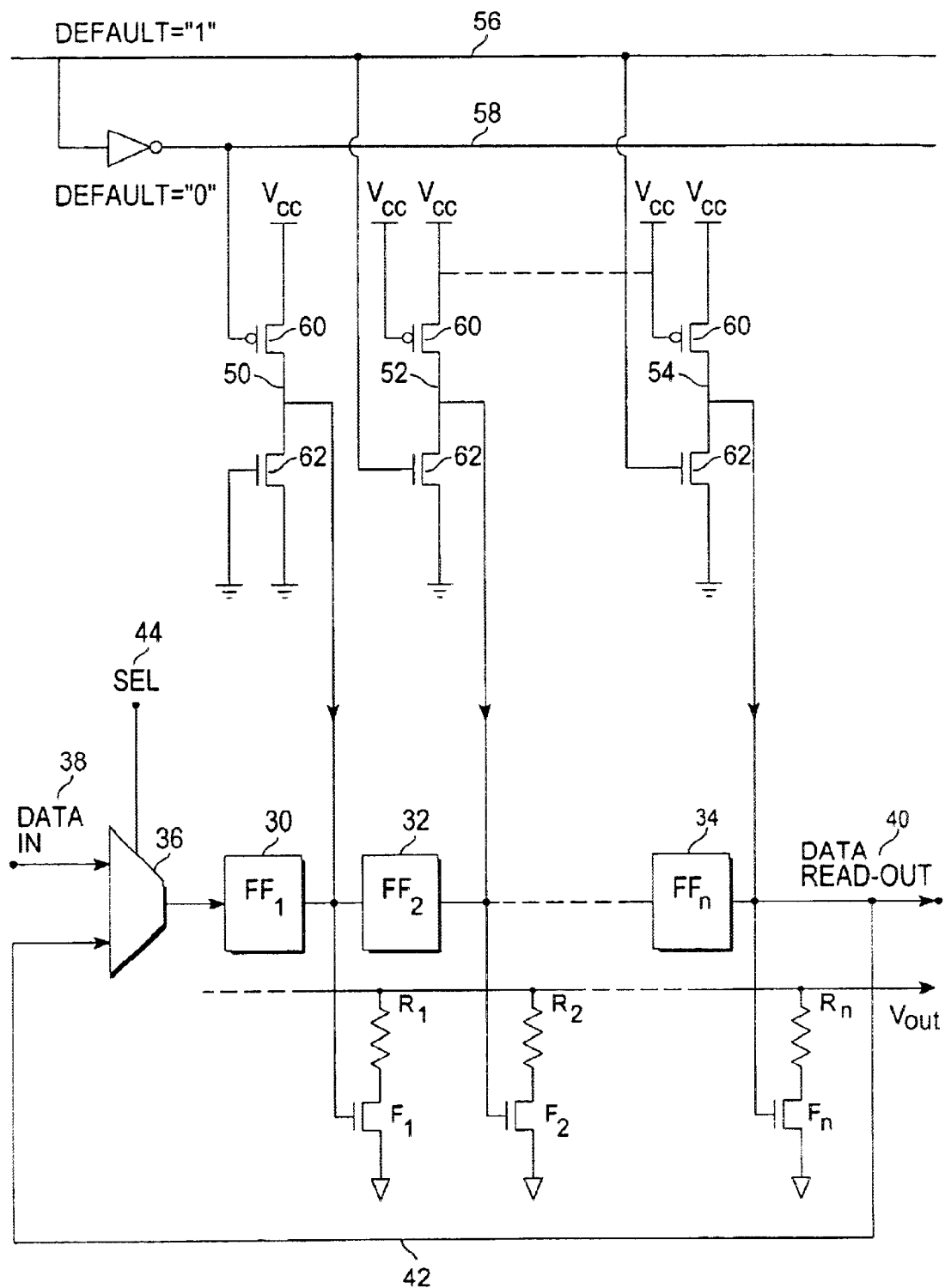
FIG. 3 is a circuit diagram showing another preferred embodiment of the fuse block circuit disclosed in the present invention.

When a chip is powering up, and before the flip-flops are loaded, the switches $F_1, F_2, \ldots, F_n$ need to be set to a default condition for the chip to operate correctly, FIG. 3 shows a preferred embodiment of the present invention wherein additional circuitry is employed to provide a set of default values for the output of the flip-flops 30, 32, . . . , 34. FIG. 3 includes a multiplexor 36, a series of flip-flops 30–34, switches $F_1, F_2, \ldots, F_n$ and resistors $R_1, R_2, \ldots, R_n$ like those shown in FIG. 2. In FIG. 3, the output of each flip-flop connects to the drain of a PMOS transistor . . . pair 50, 52, . . . , 54. The source of the PMOS transistor 60 connects to a power supply Vcc while the source of the NMOS transistor 62 connects to ground. Depending of the desired default value, the gates of the transistors may be connected to a default line 56, a negated default line 58, a power supply, or a ground. In FIG. 3, the gate of the NMOS transistor 62 in the first MOS transistor pair 50 is shown to be connected to a ground while the gate of the PMOS transistor 60 is connected to the negated default line 58. As shown in the figure, since the default line 56 carries a logic 1 during power-up, the negated default line 58 carries a logic 0. As a result, the PMOS transistor 60 in the first transistor pair 50 connects the output of the first flip-flop 30 to a power supply Vcc upon start up. In FIG. 3, the gate of the PMOS transistor 60 in the second transistor pair 52 is shown to be connected to a power supply Vcc while the gate of the NMOS transistor 62 connects to the default line 56. Upon power-up, the default line 56 turns on the NMOS transistor 62, connecting the output of the second flip-flop 32 to ground By providing default values to the switches $F_1, F_2, \ldots, F_n$ the MOS transistor pairs 50, 52, . . . , 54 allow the chip to power-up properly. Once the chip is powered-up, the value in the default lines 56, 58 would be reversed, whereby disconnecting the MOS transistor pairs 50, 52, . . . , 54 from the outputs of the flip-flops. Thereafter, with an appropriate signal at the SEL terminal 44, desired data can be shifted into the flip-flops $FF_1, FF_2, \ldots, FF_n$, through the Data-in terminal 38 in the multiplexer 36.

The embodiment disclosed above involves a plurality of flip-flops connected in a serial manner, which allows the input of flip-flop states through a single input terminal. However, the present invention can also function by have a plurality of unconnected flip-flops having their outputs being connected to the plurality of switches $F_1, F_2, \ldots, F_n$ and their inputs being connected to parallel input terminal, wherein the state of each flip-flop is provided.

In addition to the use for fine-tuning wordline voltage, the present invention may also be used in other fine-tuning and testing applications as well. For instance, the "fuse" block circuit described in the present invention may be used to choose capacitor value to control strength of voltage pumps, or it may be used to choose different density for a chip, such as 512K density or 1M density in a 1 Mbit chip.

What is claimed is:

1. A circuit for fine-tuning a voltage output comprising:
   a plurality of resistors coupled in parallel with each other to said voltage output;
   said plurality of resistors, each coupled to ground through a corresponding plurality of switching transistors; and
   a plurality of flip-flops correspondingly coupled to a gate of each of said plurality of switching transistors a state in each of said plurality of switching transistors is configured to be established by a state in each of said plurality of flip-flops, where one or more said plurality of resistors are coupled to ground as determined by the states in said flip-flops.

2. The circuit of claim 1, wherein said plurality of flip-flops is further coupled to a default value generating means that provides a default value to the gate of each of said plurality of switching transistors.

3. The circuit of claim 2, wherein said default value generating means comprises a first default signal line and a second default signal line, said second default signal line carries a complementary signal to said first default signal line, said first and second default signal lines being coupled selectively to said plurality of flip-flops through a buffering means.

4. The circuit of claim 3, wherein said buffering means is at least one MOS transistor.

5. The circuit of claim 1, wherein the plurality of flip-flops is arranged as a shift register.

6. A switch controlling circuit comprising:
   a plurality of flip-flops, each of said plurality of flip-flops having an input terminal and an output terminal;
   said plurality of flip-flops coupled in a serial manner to form a chain, the input terminal of a first of the plurality of flip-flops serving as an input to said chain of said plurality of flip-flops, the output terminal of a last of the plurality of flip-flops serving as an output for said chain of said plurality of flip-flops;
   said input terminal of said flip-flop chain of said plurality of flip-flops being coupled to a multiplexer output having at least one control terminal and a plurality of input terminals, a first input terminal of said multiplexer coupled to a data input terminal, a second input terminal coupled to said output of said chain of said plurality of flip-flops, said plurality of flip-flops configured to be programmed by applying data to said first input terminal of said multiplexer; and
   said outputs of each of said plurality of flip-flops correspondingly coupled to a plurality of switching transistors, said outputs of said plurality of flip-flops configured to activate or deactivate said transistor switches.

7. The switch controlling circuit of claim 6, wherein the output of each of said plurality of flip-flops further couples to a corresponding NMOS transistor and a corresponding PMOS transistor, forming a common node that also serves as the output of a transistor pair;
   a source of said PMOS transistor being coupled to a power supply;
   a source of said NMOS transistor being coupled to a ground;
   wherein a gate of said NMOS transistor and a gate of said PMOS transistor are each driven to pre-determined default logic values.

\* \* \* \* \*